(12) United States Patent
Chiu

(10) Patent No.: US 8,120,928 B2
(45) Date of Patent: Feb. 21, 2012

(54) ELECTRONIC DEVICE WITH A FIXING MEMBER

(75) Inventor: Ming-Chien Chiu, Taipei Hsien (TW)

(73) Assignee: Hon Hai Precision Industry Co., Ltd., Tu-Cheng, New Taipei (TW)

( * ) Notice: Subject to any disclaimer, the term of this patent is extended or adjusted under 35 U.S.C. 154(b) by 253 days.

(21) Appl. No.: 12/697,346

(22) Filed: Feb. 1, 2010

(65) Prior Publication Data
US 2011/0127082 A1  Jun. 2, 2011

(30) Foreign Application Priority Data
Nov. 27, 2009 (CN) ............... 2009 2 0315982 U

(51) Int. Cl.
*H01R 33/00* (2006.01)
(52) U.S. Cl. ........ 361/801; 361/810; 361/802; 361/823; 361/825; 361/807
(58) Field of Classification Search ............ 361/801, 361/802, 823, 825, 807, 810; 174/520
See application file for complete search history.

(56) References Cited

U.S. PATENT DOCUMENTS

| | | | |
|---|---|---|---|
| 6,574,121 B1 * | 6/2003 | Franz et al. | 361/825 |
| 7,349,228 B1 * | 3/2008 | Ray et al. | 361/801 |
| 7,602,619 B2 * | 10/2009 | Fabrizi et al. | 361/807 |
| 7,798,460 B2 * | 9/2010 | Park | 248/324 |

* cited by examiner

*Primary Examiner* — Tuan T Dinh
*Assistant Examiner* — Hung Dang
(74) *Attorney, Agent, or Firm* — Altis Law Group, Inc.

(57) ABSTRACT

An electronic device includes an enclosure and a fixing member to secure the enclosure to a fastener. The receiving member defines a first receiving portion and a second receiving portion in communication with the first receiving portion. The fixing member includes a control portion received in the receiving member and moving relative to the enclosure along a first axis of the first receiving portion, and a locking portion received in the receiving member and moving relative to the enclosure along a second axis of the second receiving portion perpendicular to the first axis. Movements of the control portion relative to the enclosure along the first axis of the first receiving portion and the locking portion relative to the enclosure along the second axis of the second receiving portion causes the electronic device to toggle in a locked or unlocked position.

17 Claims, 6 Drawing Sheets

ELECTRONIC DEVICE WITH A FIXING MEMBER

BACKGROUND

1. Technical Field

The present disclosure relates to electronic devices, and more particularly to an electronic device with a fixing member to secure the electronic device to a vertical surface.

2. Description of Related Art

To save space, electronic devices, for example phones, can be wall-mounted using bolts or other fasteners. Frequently, an electronic device includes a groove in which the fastener is received. However, the electronic device has no structure to secure the electronic device to the fastener, resulting in possible disengagement of the electronic device from the fastener, and accordingly, damage or loss thereto.

Therefore, a need exists in the industry to overcome the described limitations.

DETAILED DESCRIPTION

Figure 1:
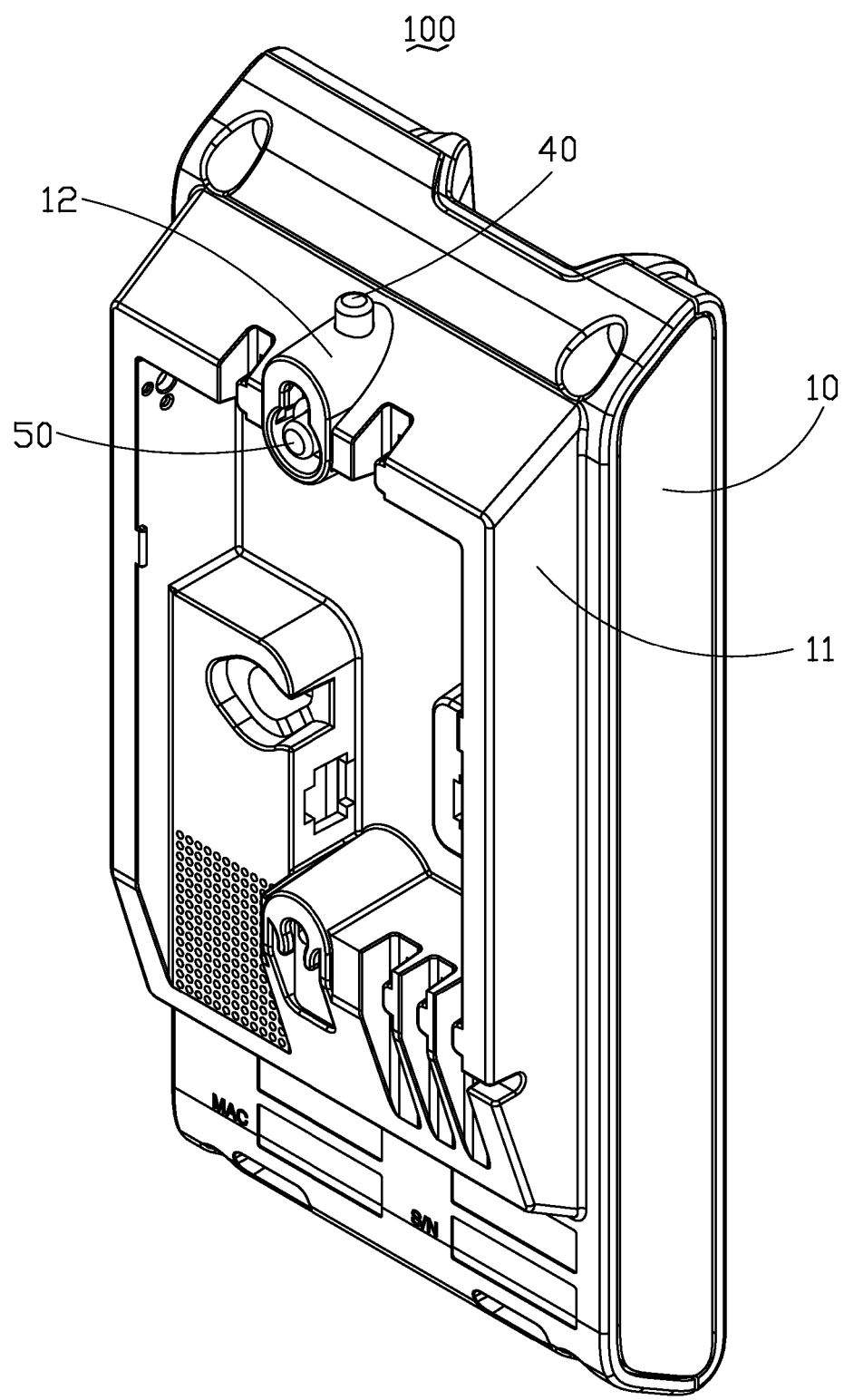
FIG. 1 is an assembled view of an electronic device of an exemplary embodiment of the disclosure.
Figure 2:
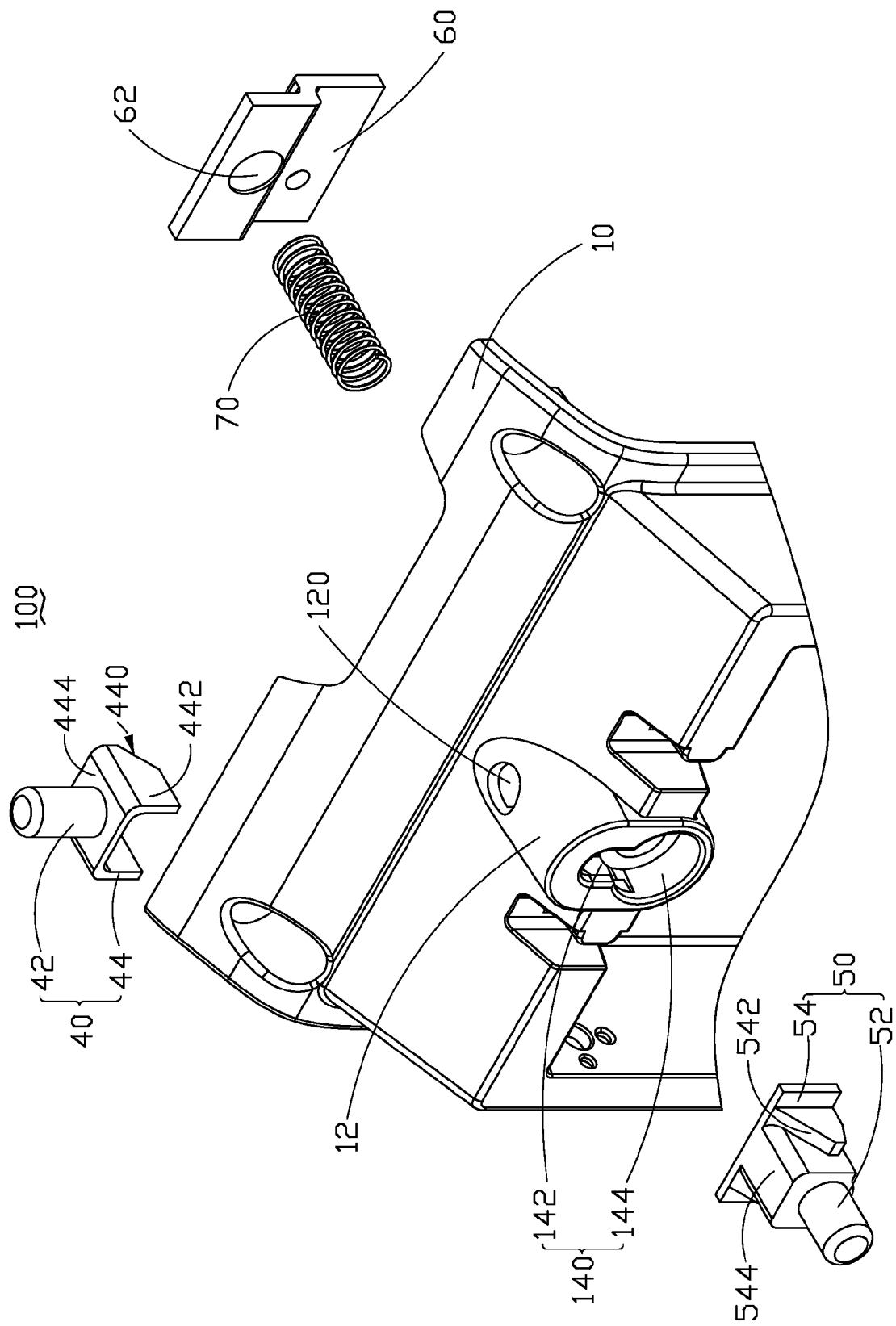
FIG. 2 is a partially exploded, isometric view of the electronic device of FIG. 1.
Figure 3:
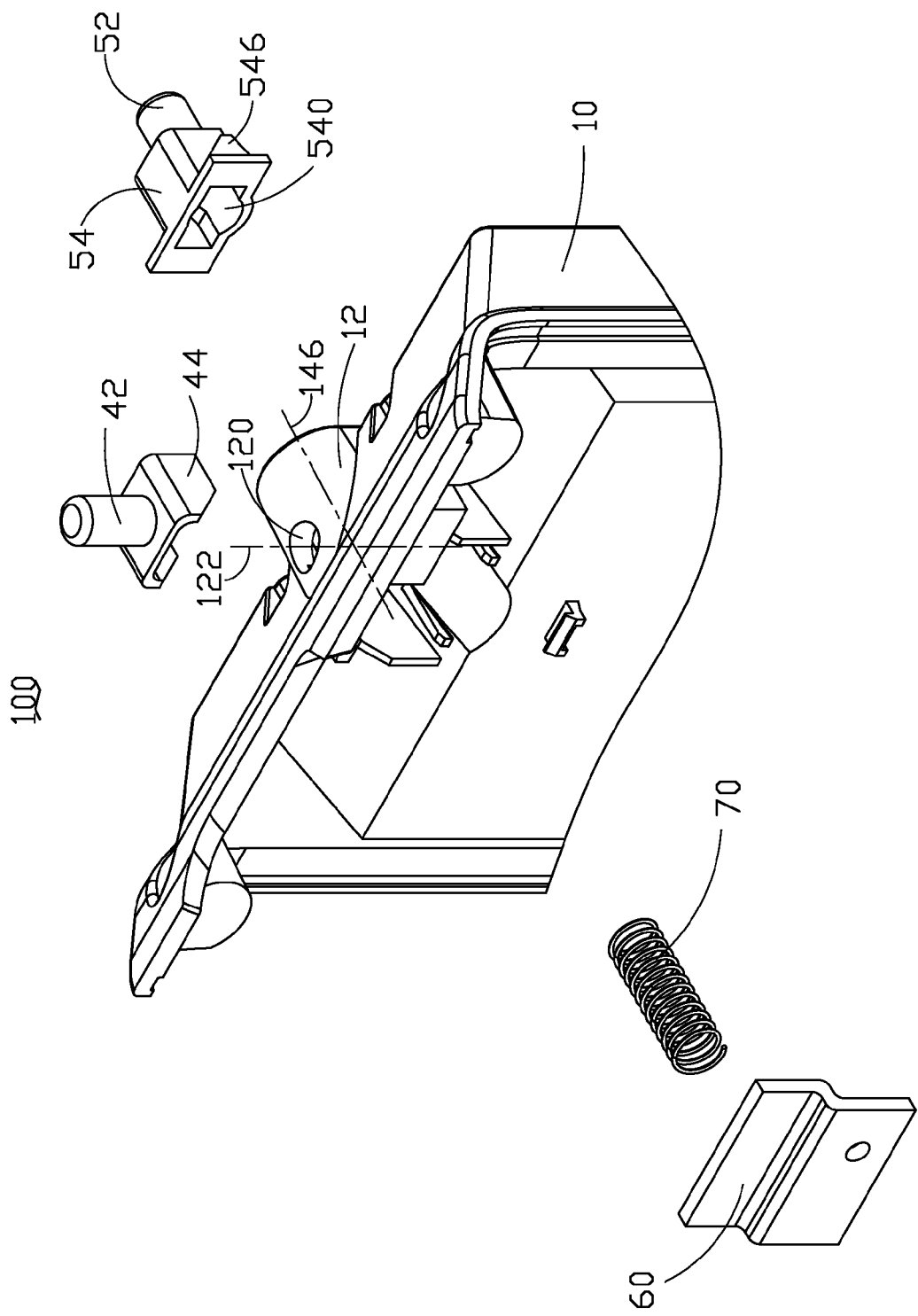
FIG. 3 is similar to of FIG. 2, viewed from another aspect.

Referring to FIG. 1, FIG. 2, and FIG. 3, an electronic device 100 of an exemplary embodiment of the present disclosure is illustrated. The electronic device 100 includes an enclosure 10 and a fixing member 30. The electronic device 100 may be a phone, but the disclosure is not limited thereto.

The enclosure 10 accommodates electronic components, such as printed circuit boards (PCBs) and central processing units (CPUs), for example. Although, the illustrated embodiment shows the enclosure 10 being substantially rectangular, it will be understood that other configurations may be utilized with equal applicability. The enclosure 10 includes a receiving member 12 defined in a back wall 11 of the enclosure 10. The receiving member 12 defines a first receiving portion 120 and a second receiving portion 140 in communication with the first receiving portion 120. A first axis 122 of the first receiving portion 120 is perpendicular to a second axis 146 of the second receiving portion 140. A cross section of the second receiving portion 140 is substantially gourd shaped. The second receiving portion 140 includes a first receiving hole 142 to receive a head of a fastener 200 on a vertical surface (e.g., a wall) and a second receiving hole 144 in communication with the first receiving hole 142. A radius of the head of the fastener 200 is greater than a radius of the first receiving hole 142, and is less than a radius of the second receiving hole 144.

The fixing member 30 secures the enclosure 10 to the fastener 200, and includes a control portion 40, a locking portion 50, a blocking portion 60, and a resilient member 70.

The control portion 40 is received in the receiving member 12, and moves along the first axis 122 of the first receiving portion 120 relative to the enclosure 10. The control portion 40 includes a control 42 received in the first receiving portion 120, and a driving part 44 integrally formed with the control 42. A cross section of the driving part 44 is substantially C-shaped. The driving part 44 includes a pair of first slopes 440 located on two arms 442 thereof. The control 42 projects from a middle of a main body 444 of the driving part 44.

The locking portion 50 is received in the receiving member 12, and moves along the second axis 146 of the second receiving portion 140 relative to the enclosure 10. The locking portion 50 includes a post 52 received in the second receiving hole 144 and a moving part 54 integrally formed with the post 52. The moving part 54 includes a mounting hole 540 in a main portion 544 of the moving part 54, and a pair of second slopes 542 located on two rib portions 546 positioned on opposite sides of the main portion 544.

The blocking portion 60 is substantially Z-shaped, and is retained in an inner portion of the enclosure 10. The blocking portion 60 defines a locating hole 62 corresponding to the mounting hole 540.

One end of the resilient member 70 is received in the locating hole 62, and the other end of the resilient member 70 is received in the mounting hole 540. In the illustrated embodiment, the resilient member 70 is a spring.

Figure 4:
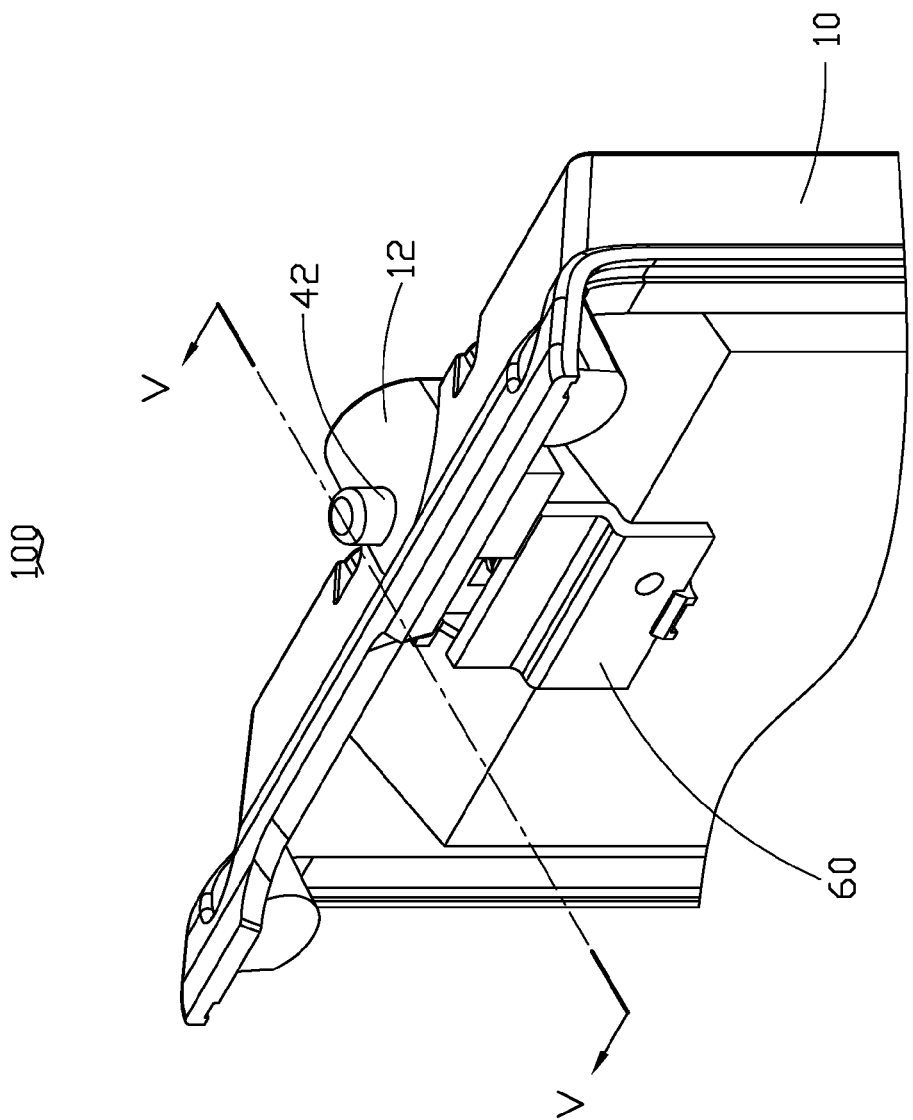
FIG. 4 is an assembled view of FIG. 3.

Referring to FIG. 4, in assembly, the control portion 40 is received in the receiving member 12 with the control 42 being received in the first receiving portion 120, and the locking portion 50 is received in the receiving member 12 with the post 52 being received in the second receiving hole 144. The blocking portion 60 is fixed in the enclosure 10 with the resilient member 70 between the locking portion 50 and the blocking portion 60. Thus, the enclosure 10 and a fixing member 30 are assembled into the electronic device 100.

Figure 5:
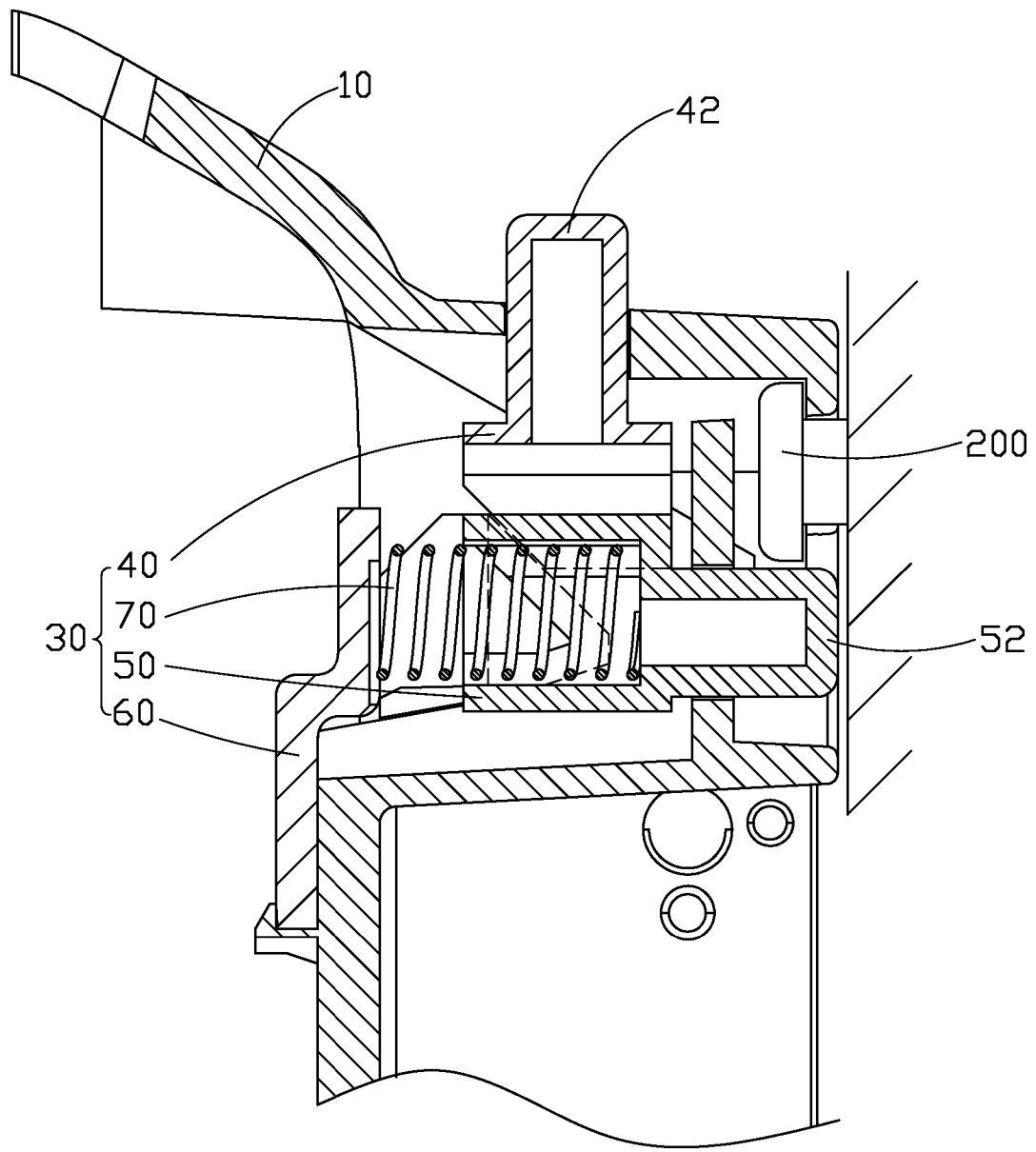
FIG. 5 is a cross-section along line V-V of FIG. 4, showing the electronic device in a locked position.
Figure 6:
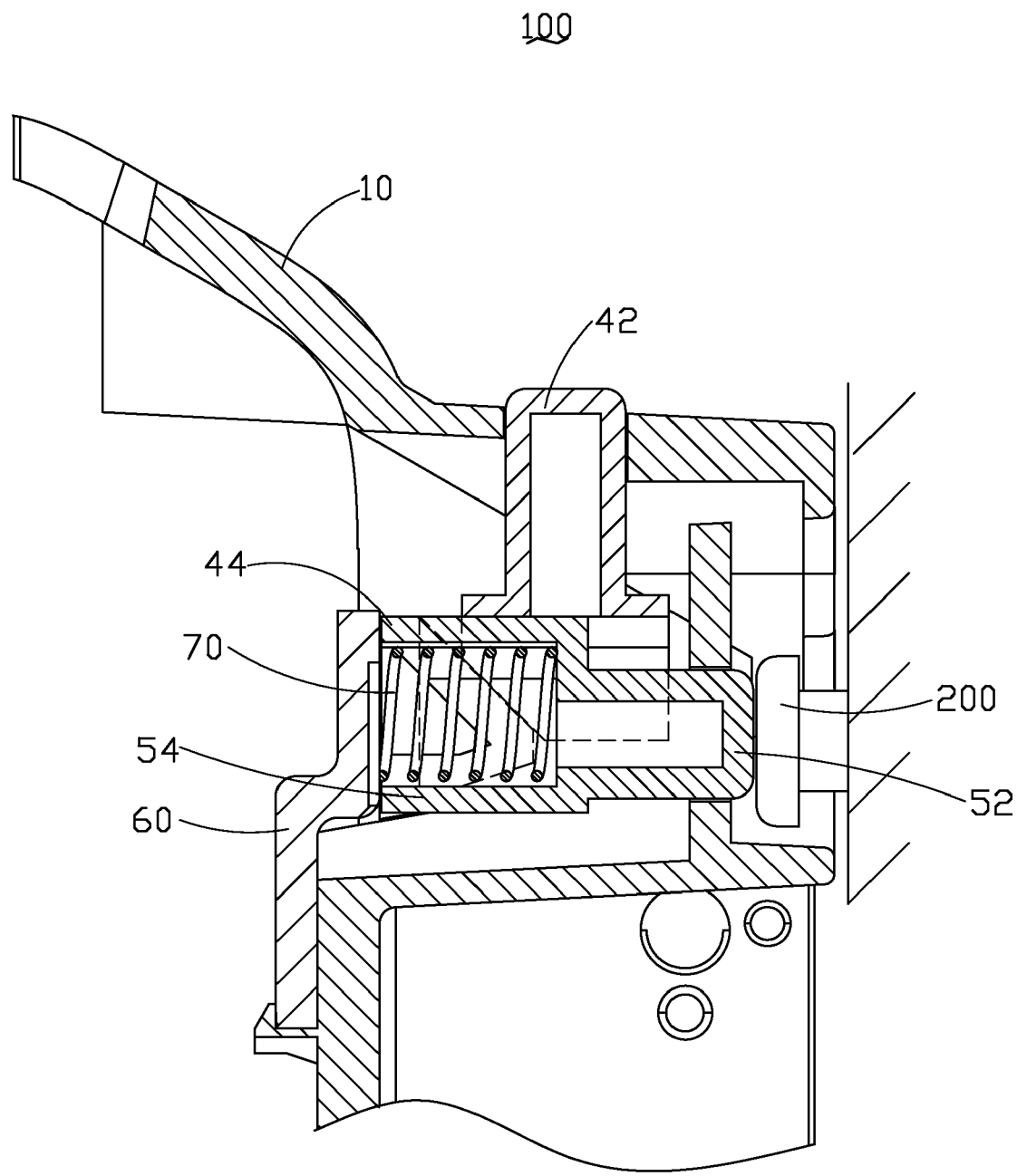
FIG. 6 is similar to FIG. 5, but showing the electronic device in an unlocked position.

FIG. 5 is an assembled view of the electronic device 100 in a locked position. FIG. 6 is an assembled view of the electronic device 100 in an unlocked position. In use, the control 42 is impelled relative to the enclosure 10 along the first axis 122 and a first direction with each of the pair of first slopes 440 applying a corresponding force on each of the pair of second slopes 542 of the moving part 54 to impel the moving part 54 relative to the enclosure 10 along the second axis 546 and a second direction perpendicular to the first direction, while the post 52 moves toward the blocking portion 60, relocating the electronic device 100 to be in the unlocked position. In the unlocked position, the resilient member 70 is compressed, and the head of the fastener 200 can move between the first receiving hole 142 and the second receiving hole 144 so that the electronic device 100 can be disengaged from the fastener 200 or hung on the fastener 200.

After the electronic device 100 is disengaged from the fastener 200 or hung on the fastener 200, the resilient member 70 decompresses and moves the locking portion 50 relative to the enclosure 10 along the second axis 546 and a third direction opposite to the second direction with each of the pair of second slopes 542 applying a corresponding force on each of the pair of first slopes 440 to move the driving part 44 along the first axis 122 and a fourth direction opposite to the first direction until the control 42 protrudes out of the first receiving portion 120, while the post 52 moves back relative to the blocking portion 60, resulting in the electronic device 100 being in the locked position. In the locked position, the head of fastener 100 cannot move between the second receiving portion 140 and the first receiving hole 142 and the electronic device 100 is secured to the fastener 200, avoiding damage or loss associated with accidental disengagement.

Specifically, the first slopes 440 and the second slope 542 cooperatively impel the control portion 40 relative to the enclosure 10 along the first axis 122 of the first receiving portion 120 and the locking portion 50 relative to the enclosure 10 along the second axis 146 of the second receiving portion 140, causing the electronic device 100 to toggle in the locked or unlocked position. The movement of the post 52 relative to the enclosure allows the head of the fastener 200 to move between the first receiving hole 142 and the second receiving hole 144, causing the electronic device 100 to toggle between the locked position and the unlocked position.

While an embodiment of the present disclosure has been described above, it should be understood that it has been presented by way of example only and not by way of limitation. Thus the breadth and scope of the present disclosure should not be limited by the above-described embodiments, but should be defined only in accordance with the following claims and their equivalents.

What is claimed is:

1. An electronic device, comprising:
   an enclosure comprising a receiving member located in a back wall of the enclosure, the receiving member defining a first receiving portion and a second receiving portion in communication with the first receiving portion, wherein a first axis of the first receiving portion is perpendicular to a second axis of the second receiving portion; and
   a fixing member securing the enclosure to a fastener, the fixing member comprising:
      a control portion received in the receiving member and is configured to move relative to the enclosure along the first axis of the first receiving portion; and
      a locking portion received in the receiving member and is configured to move relative to the enclosure along the second axis of the second receiving portion;
      wherein movements of the control portion relative to the enclosure along the first axis of the first receiving portion and the locking portion relative to the enclosure along the second axis of the second receiving portion position causes the electronic device to toggle between a locked and an unlocked position.

2. The electronic device as recited in claim 1, wherein a cross section of the second receiving portion is substantially gourd shaped.

3. The electronic device as recited in claim 1, wherein the second receiving portion comprises a first receiving hole to receive the head of the fastener and a second receiving hole in communication with the first receiving hole.

4. The electronic device as recited in claim 3, wherein a radius of the head of the fastener is greater than a radius of the first receiving hole, and is less than a radius of the second receiving hole.

5. The electronic device as recited in claim 3, wherein the locking portion comprises a post received in the second receiving hole.

6. The electronic device as recited in claim 5, wherein movement of the post relative to the enclosure allows the head of the fastener to move between the first receiving hole and the second receiving hole, causing the electronic device to toggle in the locked or unlocked position.

7. The electronic device as recited in claim 1, wherein the control portion comprises a control received in the first receiving portion and a driving part comprising a pair of first slopes.

8. The electronic device as recited in claim 7, wherein the locking portion comprises a moving part comprising a pair of second slopes, and the pair of first slopes and the pair of second slopes cooperatively impel the control portion relative to the enclosure along the first axis of the first receiving portion and the locking portion relative to the enclosure along the second axis of the second receiving portion.

9. The electronic device as recited in claim 1, wherein the fixing member further comprises a blocking portion retained in the enclosure, and a resilient member between the locking portion and the blocking portion.

10. An electronic device, comprising:
    an enclosure comprising a receiving member located in a back wall of the enclosure, the receiving member defining a first receiving portion and a second receiving portion in communication with the first receiving portion; and
    a fixing member to secure the enclosure to a fastener, the fixing member comprising:
       a control portion received in the receiving member and is configured to move relative to the enclosure along a first axis of the first receiving portion;
       a locking portion received in the receiving member and is configured to move relative to the enclosure along a second axis of the second receiving portion;
       a blocking portion retained in the enclosure; and
       a resilient member between the locking portion and the blocking portion;
    wherein the control portion is impelled relative to the enclosure along the first axis of the first receiving portion and a first direction and moves the locking portion relative to the enclosure along the second axis of the second receiving portion and a second direction perpendicular to the first direction, resulting in the resilient member being compressed and the electronic device being in an unlocked position, and wherein the resilient member decompresses and moves the locking portion relative to the enclosure along the second axis of the second receiving portion and a third direction opposite to the second direction to move the control portion relative to the enclosure along the first axis of the first receiving portion and a fourth direction opposite to the first direction, resulting in the electronic device being in a locked position.

11. The electronic device as recited in claim 10, wherein a cross section of the second receiving portion is substantially gourd shaped.

12. The electronic device as recited in claim 10, wherein the second receiving portion comprises a first receiving hole to receive a head of the fastener and a second receiving hole in communication with the first receiving hole.

13. The electronic device as recited in claim 12, wherein a radius of the head of the fastener is greater than a radius of the first receiving hole, and is less than a radius of the second receiving hole.

14. The electronic device as recited in claim 12, wherein the locking portion comprises a post received in the second receiving hole.

15. The electronic device as recited in claim 14, wherein movement of the post relative to the blocking portion allows the head of the fastener to move between the first receiving hole and the second receiving hole, causing the electronic device to toggle in the locked position and the unlocked position.

16. The electronic device as recited in claim 10, wherein the control portion comprises a control received in the first receiving portion and a driving part comprising a pair of first slopes.

17. The electronic device as recited in claim 16, wherein the locking portion comprises a moving part comprising a pair of second slopes, and the pair of first slopes and the pair of second slopes cooperatively impel the control portion relative to the enclosure along the first axis of the first receiving portion and the locking portion relative to the enclosure along the second axis of the second receiving portion.

* * * * *